United States Patent
Heo

(10) Patent No.: US 10,062,646 B2
(45) Date of Patent: Aug. 28, 2018

(54) SEMICONDUCTOR INTEGRATED CIRCUIT AND ELECTRONIC SYSTEM INCLUDING THE SAME

(71) Applicant: Samsung Electronics Co., Ltd., Suwon-si, Gyeonggi-do (KR)

(72) Inventor: Hun Heo, Seoul (KR)

(73) Assignee: SAMSUNG ELECTRONICS CO., LTD. (KR)

(*) Notice: Subject to any disclaimer, the term of this patent is extended or adjusted under 35 U.S.C. 154(b) by 121 days.

(21) Appl. No.: 15/177,333

(22) Filed: Jun. 8, 2016

(65) Prior Publication Data

US 2017/0011999 A1   Jan. 12, 2017

(30) Foreign Application Priority Data

Jul. 8, 2015  (KR) .................. 10-2015-0097092

(51) Int. Cl.
  *H01L 23/528* (2006.01)
  *H01L 27/02* (2006.01)
  *G11C 5/06* (2006.01)
  *H01L 23/522* (2006.01)

(52) U.S. Cl.
  CPC ...... *H01L 23/5286* (2013.01); *H01L 23/5226* (2013.01); *H01L 27/0207* (2013.01); *G11C 5/063* (2013.01)

(58) Field of Classification Search
  CPC ............. H01L 23/5286; H01L 23/5226; H01L 27/0207; G11C 5/06
  See application file for complete search history.

(56) References Cited

U.S. PATENT DOCUMENTS

| | | | |
|---|---|---|---|
| 6,657,307 B2 | 12/2003 | Iwamoto | |
| 6,925,627 B1 | 8/2005 | Longway et al. | |
| 7,219,324 B1 | 5/2007 | Sherlekar et al. | |
| 7,279,926 B2 | 10/2007 | Severson et al. | |
| 7,786,566 B2 | 8/2010 | Tomotani | |
| 2003/0001171 A1* | 1/2003 | Banno | G06F 17/5068 257/207 |
| 2006/0175637 A1 | 8/2006 | Lee | |
| 2007/0044057 A1 | 2/2007 | Kitani et al. | |
| 2007/0256044 A1 | 11/2007 | Coryer et al. | |
| 2010/0169851 A1* | 7/2010 | Kumagai | H01L 23/5286 716/121 |

FOREIGN PATENT DOCUMENTS

| | | |
|---|---|---|
| JP | 2003167936 A | 6/2003 |
| JP | 2009246176 A | 10/2009 |
| JP | 2010165756 A | 7/2010 |

* cited by examiner

*Primary Examiner* — Peniel M Gumedzoe

(74) *Attorney, Agent, or Firm* — Renaissance IP Law Group LLP

(57) ABSTRACT

A semiconductor integrated circuit comprising: a first macro cell including a first power line in a first wiring layer; a second macro cell adjacent to the first macro cell, the second macro cell including a second power line in the first wiring layer; a first connection part in the first wiring layer, the first connection part electrically connecting the first power line with the second power line; and a third power line in a second wiring layer different from the first wiring layer, the third power line electrically connected to the first power line; wherein the second power line is electrically connected to the third power line through the first connection part.

15 Claims, 15 Drawing Sheets

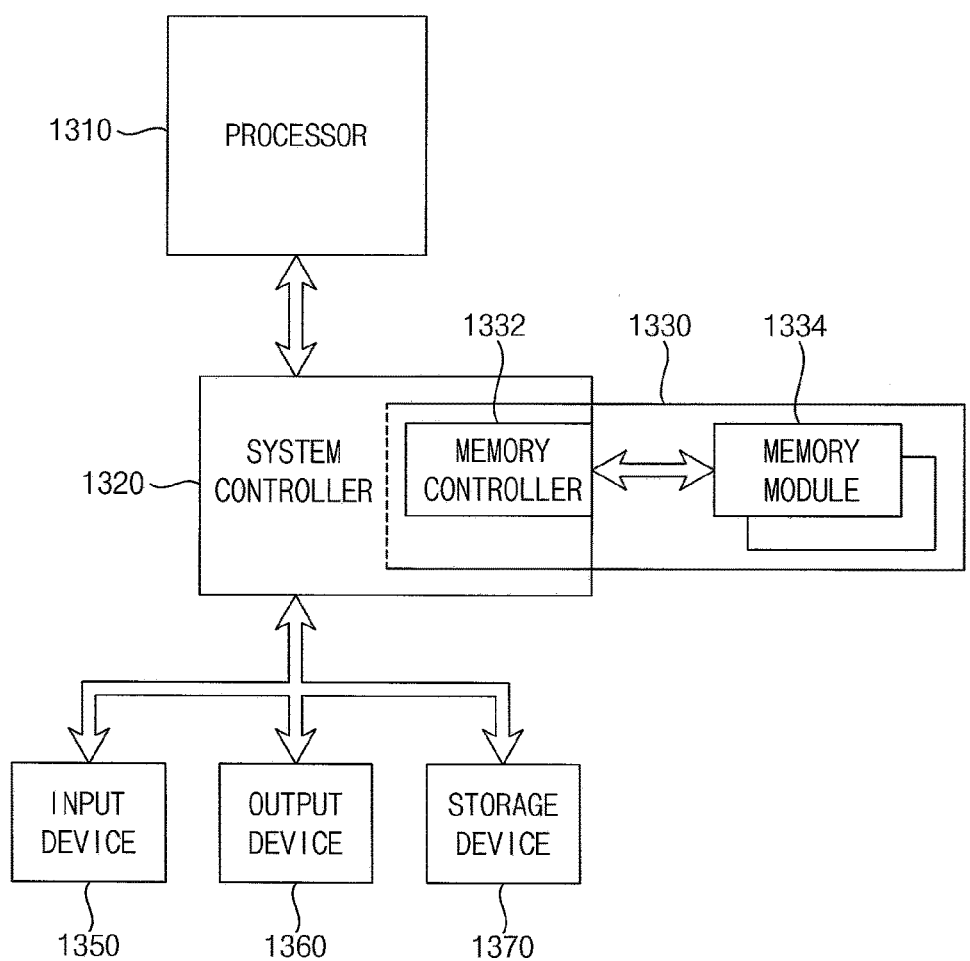

SEMICONDUCTOR INTEGRATED CIRCUIT AND ELECTRONIC SYSTEM INCLUDING THE SAME

CROSS-REFERENCE TO RELATED APPLICATION

This application claims priority under 35 USC § 119 to Korean Patent Application No. 10-2015-0097092, filed on Jul. 8, 2015 in the Korean Intellectual Property Office (KIPO), the contents of which are herein incorporated by reference in their entirety.

BACKGROUND

1. Technical Field

Example embodiments relate generally to semiconductor devices, and more particularly to semiconductor integrated circuits and electronic systems including the semiconductor integrated circuits.

2. Description of the Related Art

As the degree of integration of semiconductor devices increases, a larger number of components have been integrated into one semiconductor chip. Multiple macro cells, each of which includes multiple components such as logic elements, memory elements and analog elements in a predetermined region, may be provided in the semiconductor chip to implement the overall functionality of an electronic system. Various schemes have been researched to supply power to the components in the macro cells.

SUMMARY

An embodiment includes a semiconductor integrated circuit comprising: a first macro cell including a first power line in a first wiring layer; a second macro cell adjacent to the first macro cell, the second macro cell including a second power line in the first wiring layer; a first connection part in the first wiring layer, the first connection part electrically connecting the first power line with the second power line; and a third power line in a second wiring layer different from the first wiring layer, the third power line electrically connected to the first power line; wherein the second power line is electrically connected to the third power line through the first connection part.

An embodiment includes an electronic system comprising: a processor; and a plurality of functional blocks controlled by the processor, wherein the processor includes: a first macro cell including a first element and a first power line in a first wiring layer; a second macro cell adjacent to the first macro cell, the second macro cell including a second element and a second power line in the first wiring layer; a first connection part in the first wiring layer, the first connection part electrically connecting the first power line with the second power line; and a third power line in a second wiring layer different from the first wiring layer, the third power line electrically connected to the first power line to the first element and the second element through the first power line and the second power line, respectively.

An embodiment includes a semiconductor integrated circuit comprising: a first macro cell including a first power line in a first wiring layer; a second macro cell adjacent to the first macro cell, the second macro cell including a second power line in the first wiring layer; and a third power line in a second wiring layer different from the first wiring layer, the third power line electrically connected to the first power line; wherein the second power line is electrically connected to the third power line through the first power line.

BRIEF DESCRIPTION OF THE DRAWINGS

Embodiments will be more clearly understood from the following detailed description taken in conjunction with the accompanying drawings.

FIG. 15 is a block diagram illustrating a memory system including a semiconductor integrated circuit according to some embodiments.

DETAILED DESCRIPTION OF THE EMBODIMENTS

Figure 1:
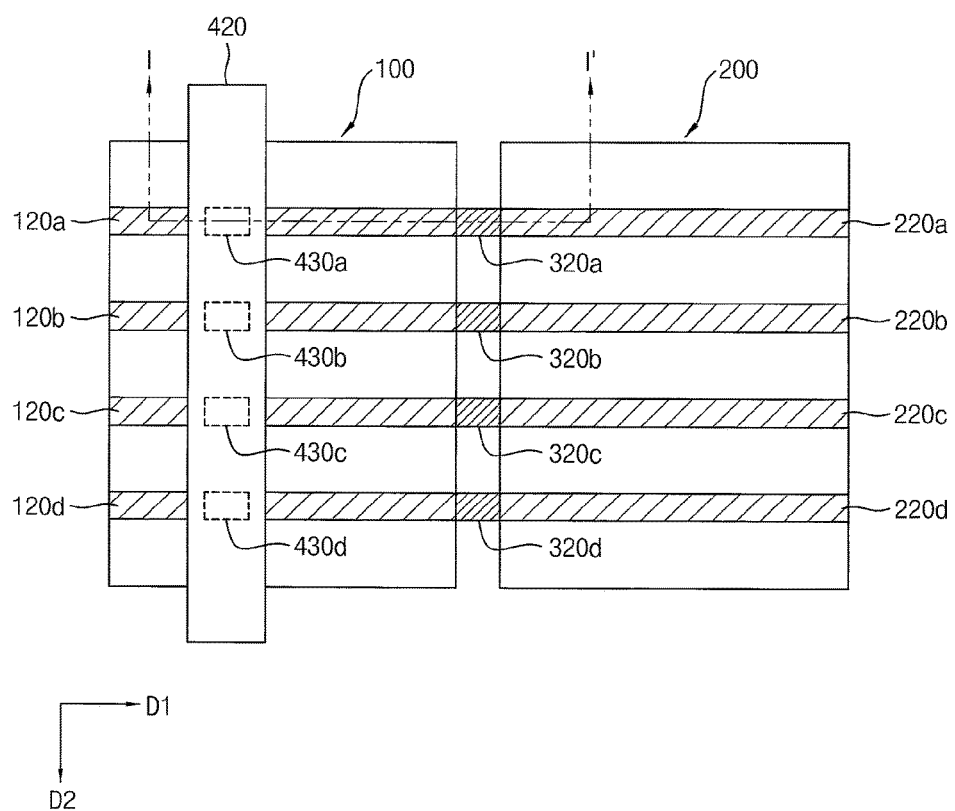
FIG. 1 is a plan view illustrating a semiconductor integrated circuit according to some embodiments.

Various embodiments will be described more fully with reference to the accompanying drawings, in which particular embodiments are shown. Embodiments may, however, take many different forms and should not be construed as limited to the particular embodiments set forth herein. Rather, these embodiments are provided so that this disclosure will be thorough and complete, and will fully convey the scope of the present disclosure to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
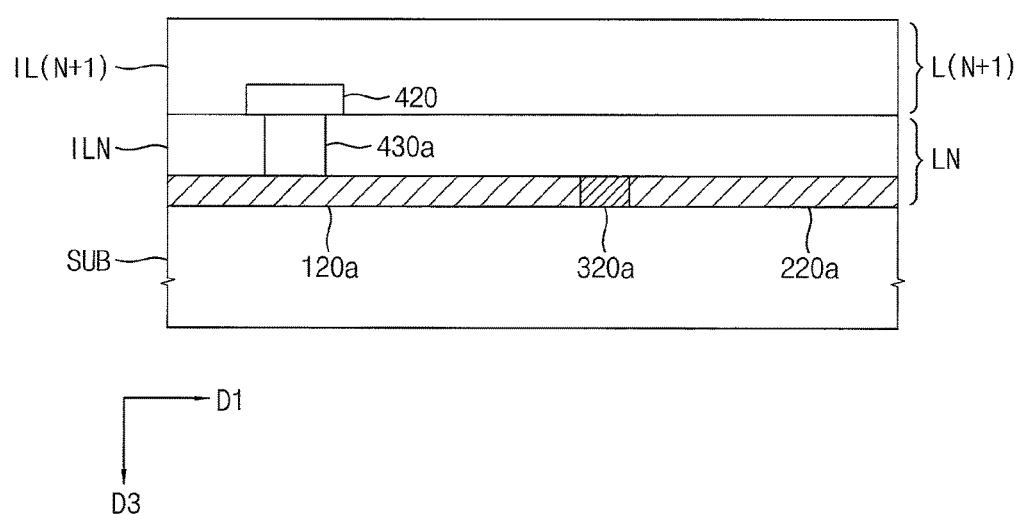
FIG. 2 is a cross-sectional view illustrating the semiconductor integrated circuit taken along line I-I' of FIG. 1.

FIG. 1 is a plan view illustrating a semiconductor integrated circuit according to some embodiments. FIG. 2 is a cross-sectional view illustrating the semiconductor integrated circuit taken along line I-I' of FIG. 1. Referring to FIGS. 1 and 2, a semiconductor integrated circuit 10 includes a first macro cell 100 including multiple first power lines 120a, 120b, 120c and 120d, a second macro cell 200 including multiple second power lines 220a, 220b, 220c and 220d, multiple first connection parts 320a, 320b, 320c and 320d, and a third power line 420.

The semiconductor integrated circuit 10 according to some embodiments may be implemented as a semiconductor chip. The semiconductor integrated circuit 10 may operate and may perform various functions based on configurations of the macro cells 100 and 200. Although not illustrated in FIGS. 1 and 2, each of the macro cells 100 and 200 may include multiple elements for operating the semiconductor integrated circuit 10 and for performing the various functions. For example, the elements may include an active element, a passive element, an analog element, a digital element, a logic element, or the like. In an example of FIGS. 1 and 2, the power lines 120a~120d, 220a~220d and 420 may be formed to supply one power voltage to the macro cells 100 and 200 (e.g., to the elements in the macro cells 100 and 200).

The first power lines 120a~120d are formed in a first wiring layer LN. For example, the macro cells 100 and 200 may include N wiring layers, such as macro-level wiring layers, where N is a natural number. The first wiring layer LN may be an uppermost wiring layer in the macro cells 100 and 200. Each of the first power lines 120a~120d may extend in a first direction D1. The first power lines 120a~120d may be arranged in a second direction D2 different from, such as substantially perpendicular to, the first direction D1.

The second macro cell 200 is adjacent to the first macro cell 100. The second power lines 220a~220d are formed in the first wiring layer LN. Each of the second power lines 220a~220d may extend in the first direction D1. The second power lines 220a~220d may be arranged in the second direction D2.

In the example of FIGS. 1 and 2, the first and second power lines 120a~120d and 220a~220d in the first wiring layer LN can be accessed by a person who designs the semiconductor integrated circuit 10. On the contrary, (N-1) macro-level wiring layers other than the first wiring layer LN in the macro cells 100 and 200 may not be accessible by a person who designs the semiconductor integrated circuit 10. That is, a designer of the semiconductor integrated circuit 10 may be able to place macro cells such as macro cells 100 and 200, but may not be able to edit the layers, internal routing, or the like of the macro cells.

The first connection parts 320a~320d are formed in the first wiring layer LN. Each of the first connection parts 320a~320d electrically connects a respective one of the first power lines 120a~120d with a respective one of the second power lines 220a~220d. For example, the connection part 320a may electrically connect the power line 120a with the power line 220a, the connection part 320b may electrically connect the power line 120b with the power line 220b, the connection part 320c may electrically connect the power line 120c with the power line 220c, and the connection part 320d may electrically connect the power line 120d with the power line 220d.

In some embodiments, the first connection parts 320a~320d may be formed of the same material as those of the first and second power lines 120a~120d and 220a~220d. For example, the first power lines 120a~120d, the second power lines 220a~220d and the first connection parts 320a~320d may include at least one conductive material selected from copper, tungsten, titanium, aluminum, or other conductive materials.

The third power line 420 is formed in a second wiring layer L(N+1) that is different from the first wiring layer LN. For example, the second wiring layer L(N+1) may not be included in the macro cells 100 and 200, and may be a wiring layer, such as a chip-level wiring layer, that is above than the first wiring layer LN. The third power line 420 may extend in the second direction D2. As with the first power lines 120a~120d, the second power lines 220a~220d and the first connection parts 320a~320d, the third power line 420 may include the at least one metal or other conductive material.

The third power line 420 is electrically connected to the first power lines 120a~120d to supply a first power voltage to the first power lines 120a~120d and the second power lines 220a~220d. For example, the first power voltage may be one of a high power voltage (e.g., a VDD voltage) and a low power voltage (e.g., a ground voltage or a VSS voltage); however, the first power voltage may be other voltages.

Hereinafter, a power line (e.g., the first and second power lines 120a~120d and 220a~220d) that is arranged in the macro cells 100 and 200 may be referred to as a macro-level power line, and a power line (e.g., the third power line 420) that is arranged on or outside the macro cells 100 and 200 may be referred to as a chip-level power line.

The semiconductor integrated circuit 10 may further include multiple first vias 430a, 430b, 430c and 430d. Each of the first vias 430a~430d may extend in a third direction D3 that is substantially perpendicular to the first direction D1 and the second direction D2. Each of the first vias 430a~430d may be formed at an intersection of a respective one of the first power lines 120a~120d and the third power line 420. Each of the first vias 430a~430d may electrically connect the respective one of the first power lines 120a~120d with the third power line 420. For example, the via 430a may electrically connect the power line 120a with the third power line 420, the via 430b may electrically connect the power line 120b with the third power line 420, the via 430c may electrically connect the power line 120c with the third power line 420, and the via 430d may electrically connect the power line 120d with the third power line 420.

In some embodiments, the macro cells 100 and 200 may be formed on a semiconductor substrate SUB. The first wiring layer LN may further include a first insulation layer ILN on the first power lines 120a~120d, the second power lines 220a~220d and the first connection parts 320a~320d. The second wiring layer L(N+1) may further include a second insulation layer IL(N+1) on the third power line 420.

In some embodiments, the first macro cell 100 may have a structure substantially the same as that of the second macro cell 200. For example, each of the first macro cell 100 and the second macro cell 200 may be a hard macro cell in which a structure is unchangeable. Thus, the first connection parts 320a~320d may be relatively easily arranged in the semiconductor integrated circuit 10 to connect the first power lines 120a~120d with the second power lines 220a~220d.

In the semiconductor integrated circuit 10 according to some embodiments, the macro-level power lines 120a~120d and 220a~220d in the adjacent macro cells 100 and 200 may be electrically connected to each other by the connection parts 320a~320d. The macro-level power lines 120a~120d and 220a~220d and the connection parts 320a~320d may be arranged in the same wiring layer (e.g., the first wiring layer LN). Accordingly, the power voltage may be supplied to both of the macro cells 100 and 200 by electrically connecting the chip-level power line 420 with one of the first power lines 120a~120d and the second power lines 220a~220d, and thus a route congestion of chip-level power lines may be reduced in the semiconductor integrated circuit 10.

Although FIG. 1 illustrates that the second direction D2 is substantially perpendicular to the first direction D1, the second direction may be changed. For example, the second direction may be a diagonal direction of the first macro cell 100, and the third power line may extend in the diagonal direction of the first macro cell 100.

Figure 3:
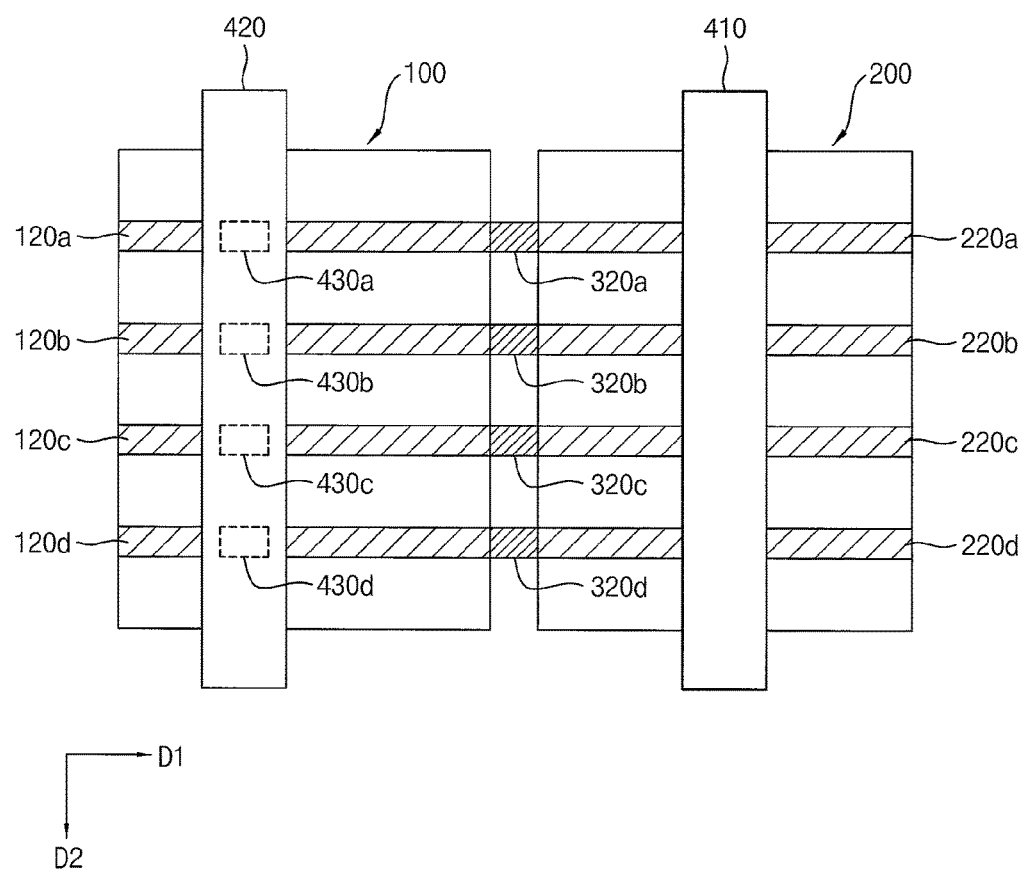
FIGS. 3 and 4 are plan views illustrating a semiconductor integrated circuit according to some embodiments.
Figure 4:
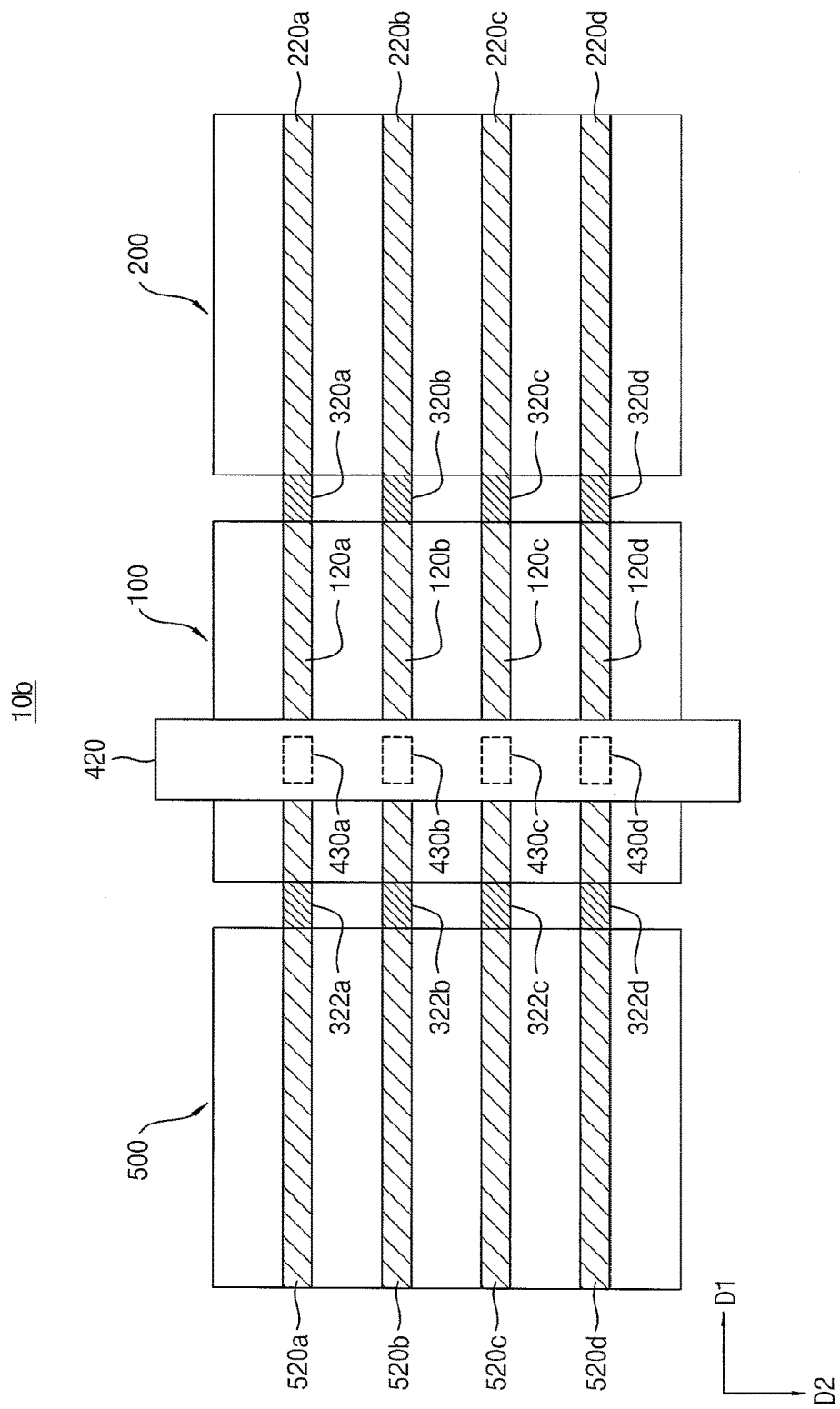

FIGS. 3 and 4 are plan views illustrating a semiconductor integrated circuit according to some embodiments. Referring to FIG. 3, a semiconductor integrated circuit 10a may be substantially the same as the semiconductor integrated circuit 10 of FIG. 1, except that the semiconductor integrated circuit 10a further includes at least one signal line 410.

The semiconductor integrated circuit 10a of FIG. 3 includes a first macro cell 100 including multiple first power lines 120a~120d, a second macro cell 200 including multiple second power lines 220a~220d, multiple first connection parts 320a~320d and a third power line 420. The semiconductor integrated circuit 10a of FIG. 3 may further include the signal line 410 and multiple first vias 430a~430d.

The signal line 410 may be formed in the second wiring layer (e.g., L(N+1) in FIG. 2), and may be formed in a region in which the third power line 420 does not exist. For example, the third power line 420 may be arranged on the first macro cell 100, and the signal line 410 may be arranged on the second macro cell 200.

The signal line 410 may be configured to supply a signal to drive at least one of the first macro cell 100 and the second macro cell 200. Although not illustrated in FIG. 3, the semiconductor integrated circuit 10a may further include at least one via that electrically connects the signal line 410 with at least one of the macro cells 100 and 200.

As described above with reference FIGS. 1 and 2, a route congestion of chip-level power lines may be reduced in the semiconductor integrated circuit 10a. In addition, in the semiconductor integrated circuit 10a according to some embodiments, the at least one signal line 410 may be arranged in an empty region in the wiring layer (e.g., L(N+1) in FIG. 2) including the chip-level power line 420. In other words, the chip-level power line 420 and the at least one signal line 410 may be arranged in the same wiring layer. Accordingly, the semiconductor integrated circuit 10a may have relatively low complexity, small size and low manufacturing cost.

Referring to FIG. 4, a semiconductor integrated circuit 10b may be substantially the same as the semiconductor integrated circuit 10 of FIG. 1, except that the semiconductor integrated circuit 10b further includes a third macro cell 500 and multiple second connection parts 322a, 322b, 322c and 322d.

The semiconductor integrated circuit 10b of FIG. 4 includes a first macro cell 100 including multiple first power lines 120a~120d, a second macro cell 200 including multiple second power lines 220a~220d, multiple first connection parts 320a~320d and a third power line 420. The semiconductor integrated circuit 10b of FIG. 4 may further include the third macro cell 500 including multiple fourth power lines 520a, 520b, 520c and 520d, the second connection parts 322a~322d, and multiple first vias 430a~430d.

The third macro cell 500 may be adjacent to the first macro cell 100. The fourth power lines 520a~520d may be formed in the first wiring layer (e.g., LN in FIG. 2). Each of the fourth power lines 520a~520d may extend in the first direction D1. The fourth power lines 520a~520d may be arranged in the second direction D2.

The second connection parts 322a~322d may be formed in the first wiring layer LN. Each of the second connection parts 322a~322d may electrically connect a respective one of the first power lines 120a~120d with a respective one of the fourth power lines 520a~520d. For example, the connection part 322a may electrically connect the power line 120a with the power line 520a, the connection part 322b may electrically connect the power line 120b with the power line 520b, the connection part 322c may electrically connect the power line 120c with the power line 520c, and the connection part 322d may electrically connect the power line 120d with the power line 520d.

In some embodiments, the fourth power lines 520a~520d and the second connection parts 322a~322d may be formed of the same material as those of the first power lines 120a~120d, the second power lines 220a~220d and the first connection parts 320a~320d.

The third power line 420 may be electrically connected to the first power lines 120a~120d to supply the first power voltage to the first power lines 120a~120d, the second power lines 220a~220d and the fourth power lines 520a~520d.

As described above with reference to FIGS. 1, 3 and 4, in each of the semiconductor integrated circuits 10, 10a and 10b according to some embodiments, a single chip-level power line may be shared by the macro cells that are electrically connected by the connection parts.

Although FIGS. 1, 3 and 4 illustrate that the third power line 420 is electrically connected to the first power lines 120a~120d, the third power line 420 may be electrically connected to one of the second power lines 220a~220d and the fourth power lines 520a~520d. For example, the first vias 430a~430d may electrically connect the third power line 420 to second power lines 220a~220d rather than the first power lines 120a~120d. Although FIG. 3 illustrates that the signal line 410 is arranged on the second macro cell 200, at least one signal line may be arranged on one of the first macro cell 100 and the third macro cell 500 in FIG. 4 such that the at least one signal line does not overlap the third power line 420.

Figure 5:
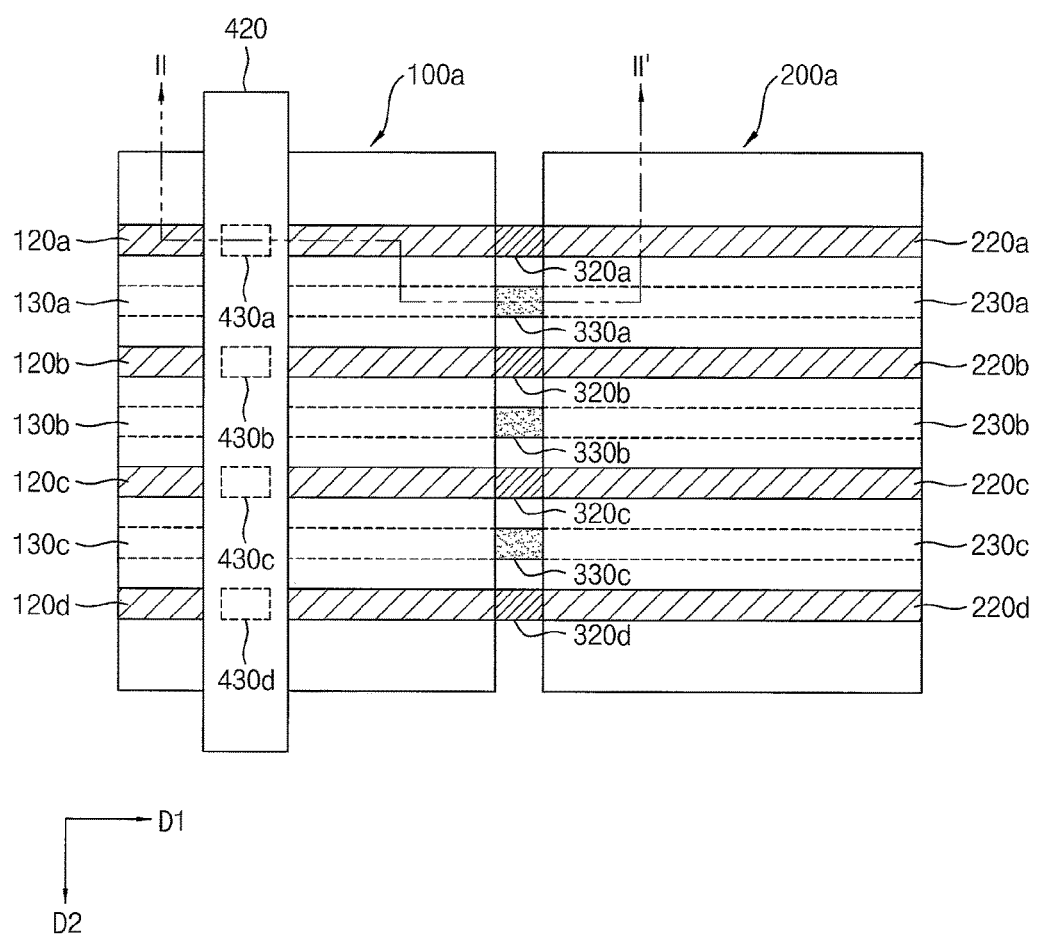
FIG. 5 is a plan view illustrating a semiconductor integrated circuit according to some embodiments.
Figure 6:
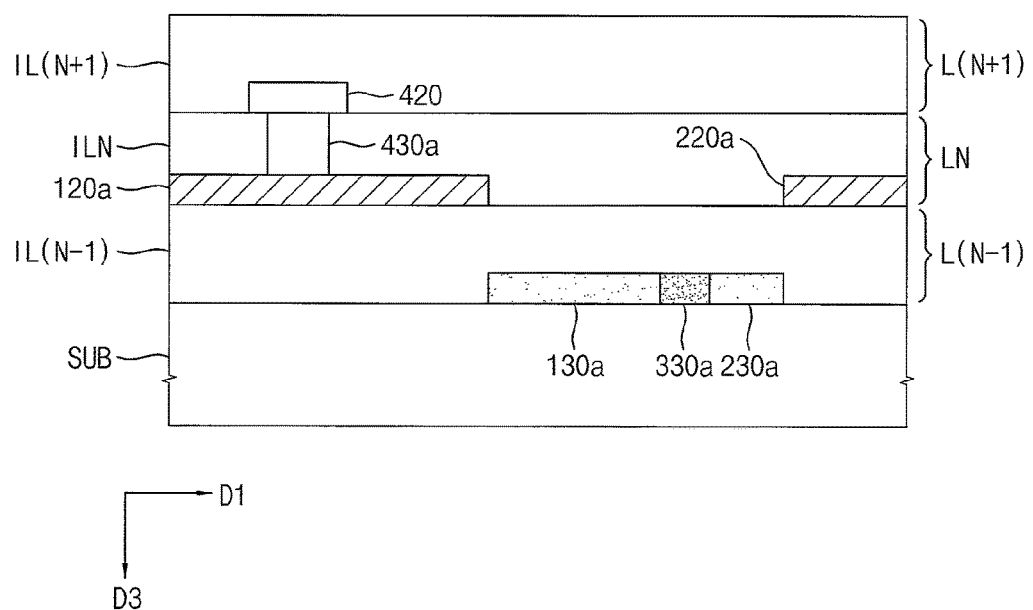
FIG. 6 is a cross-sectional view illustrating the semiconductor integrated circuit taken along line II-II' of FIG. 5.

FIG. 5 is a plan view illustrating a semiconductor integrated circuit according to some embodiments. FIG. 6 is a cross-sectional view illustrating the semiconductor integrated circuit taken along line II-II' of FIG. 5. Referring to FIGS. 5 and 6, a semiconductor integrated circuit 20 includes a first macro cell 100a including multiple first power lines 120a, 120b, 120c and 120d, a second macro cell 200a including multiple second power lines 220a, 220b, 220c and 220d, multiple first connection parts 320a, 320b, 320c and 320d, and a third power line 420. The first macro cell 100a may further include multiple fourth power lines 130a, 130b and 130c, and the second macro cell 200a may further include multiple fifth power lines 230a, 230b and 230c.

The first power lines 120a~120d may be formed in a first wiring layer LN. The fourth power lines 130a~130c may be formed in a third wiring layer L(N−1) that is different from the first wiring layer LN and a second wiring layer L(N+1). For example, the first wiring layer LN may be an uppermost wiring layer in the macro cells 100a and 200a, and the third wiring layer L(N−1) may be a wiring layer in the macro cells 100a and 200a that is lower than the first wiring layer LN. Each of the first power lines 120a~120d and the fourth power lines 130a~130c may extend in a first direction D1.

The second macro cell 200a may be adjacent to the first macro cell 100. The second power lines 220a~220d are formed in the first wiring layer LN. The fifth power lines 230a~230c may be formed in the third wiring layer L(N−1). Each of the second power lines 220a~220d and the fifth power lines 230a~230c may extend in the first direction D1.

In an example of FIGS. 5 and 6, the first and second power lines 120a~120d and 220a~220d in the first wiring layer LN and the fourth and fifth power lines 130a~130c and 230a~230c in the third wiring layer L(N−1) may be accessed by a person who designs the semiconductor integrated circuit 20.

The first connection parts 320a~320d are formed in the first wiring layer LN. Each of the first connection parts 320a~320d electrically connects a respective one of the first power lines 120a~120d with a respective one of the second power lines 220a~220d.

The semiconductor integrated circuit 20 may further include multiple second connection parts 330a, 330b and 330c. The second connection parts 330a~330c may be formed in the third wiring layer L(N−1). Each of the second connection parts 330a~330c may electrically connect a respective one of the fourth power lines 130a~130c with a respective one of the fifth power lines 230a~230c. For example, the connection part 330a may electrically connect the power line 130a with the power line 230a, the connection part 330b may electrically connect the power line 130b with the power line 230b, and the connection part 330c may electrically connect the power line 130c with the power line 230c.

In some embodiments, the fourth power lines 130a~130c, the fifth power lines 230a~230c and the second connection parts 330a~330c may be formed of the same material (e.g., at least one metal) as those of the first power lines 120a~120d, the second power lines 220a~220d and the first connection parts 320a~320d.

The third power line 420 is formed in the second wiring layer L(N+1) that is different from the first wiring layer LN. For example, the second wiring layer L(N+1) may not be included in the macro cells 100a and 200a, and may be a wiring layer that is above than the first wiring layer LN. The third power line 420 may extend in a second direction D2. The third power line 420 may include the at least one metal or other conductive material.

The third power line 420 may be electrically connected to the first power lines 120a~120d to supply a first power voltage to the first power lines 120a~120d and the second power lines 220a~220d. For example, the first power voltage may be one of a high power voltage and a low power voltage; however, any voltage level may be supplied.

The semiconductor integrated circuit 20 may further include multiple first vias 430a, 430b, 430c and 430d. Each of the first vias 430a~430d may extend in a third direction D3 that is substantially perpendicular to the first direction D1 and the second direction D2, and may be formed at an intersection of a respective one of the first power lines 120a~120d and the third power line 420. Each of the first vias 430a~430d may electrically connect the respective one of the first power lines 120a~120d with the third power line 420.

In some embodiments, the macro cells 100a and 200a are formed on a semiconductor substrate SUB. The first wiring layer LN may further include a first insulation layer ILN on the first power lines 120a~120d, the second power lines 220a~220d and the first connection parts 320a~320d. The second wiring layer L(N+1) may further include a second insulation layer IL(N+1) on the third power line 420. The third wiring layer L(N−1) may further include a third insulation layer IL(N−1) on the fourth power lines 130a~130c, the fifth power lines 230a~230c and the second connection parts 330a~330c.

Although not illustrated in FIGS. 5 and 6, the first macro cell 100a may further include at least one via that electrically connects at least one of the first power lines 120a~120d with at least one of the fourth power lines 130a~130c, and the second macro cell 200a may further include at least one via that electrically connects at least one of the second power lines 220a~220d with at least one of the fifth power lines 230a~230c. Thus, the first power voltage may also be supplied to the fourth power lines 130a~130c and the fifth power lines 230a~230c.

Although not illustrated in FIGS. 5 and 6, the semiconductor integrated circuit 20 may further include at least one signal line that is formed in the second wiring layer L(N+1) and is formed in a region in which the third power line 420 does not exist.

Although FIG. 5 illustrates that the first power lines 120a~120d and the fourth power lines 130a~130c are alternately arranged in the second direction D2, the first power lines 120a~120d and the fourth power lines 130a~130c may be spaced apart from each other or arranged in other configurations. Similarly, although FIG. 5 illustrates that the second power lines 220a~220d and the fifth power lines 230a~230c are alternately arranged in the second direction D2, the second power lines 220a~220d and the fifth power lines 230a~230c may be spaced apart from each other.

Figure 7:
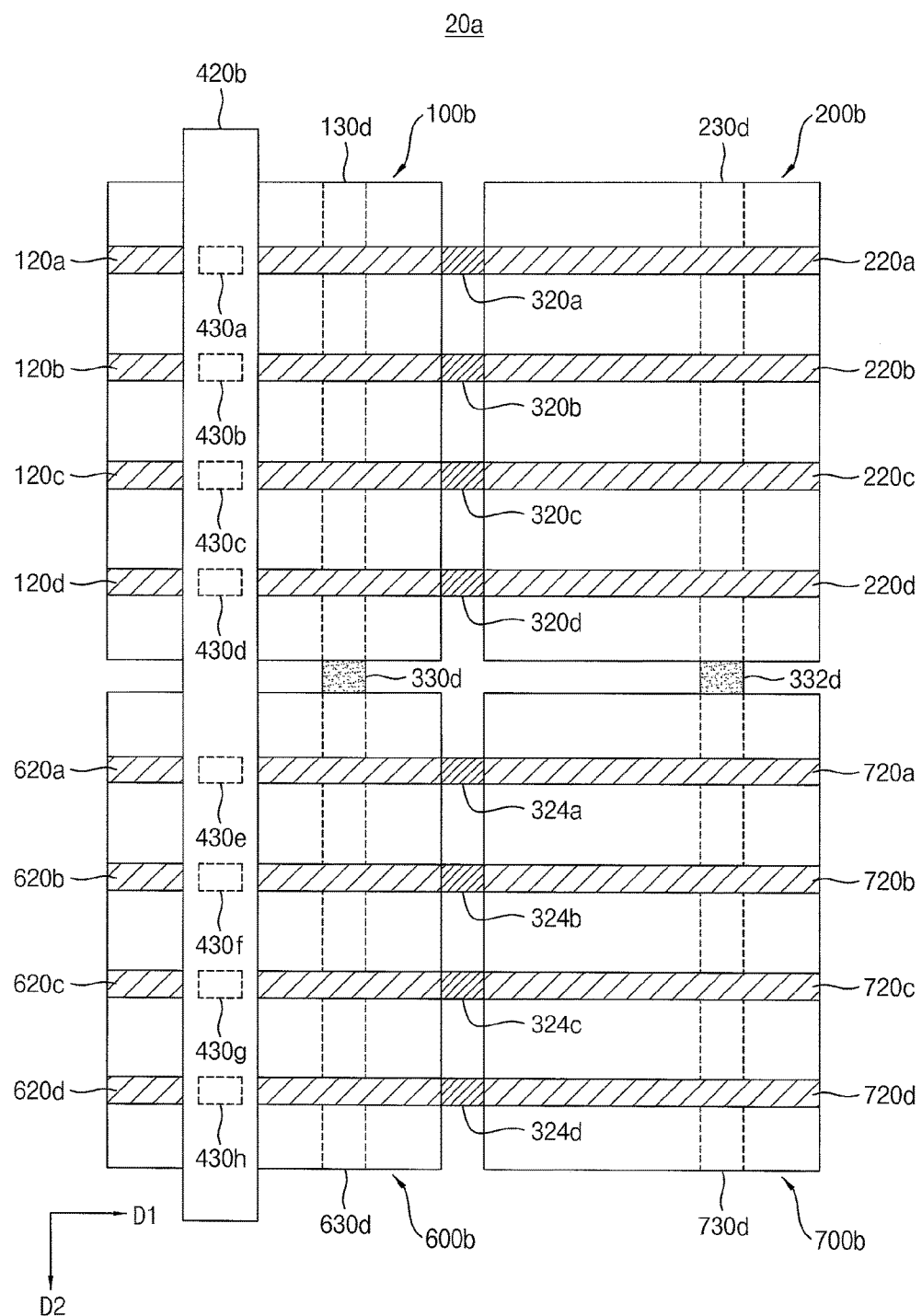
FIG. 7 is a plan view illustrating a semiconductor integrated circuit according to some embodiments.

FIG. 7 is a plan view illustrating a semiconductor integrated circuit according to some embodiments. Referring to FIG. 7, a semiconductor integrated circuit 20a includes a first macro cell 100b including multiple first power lines 120a~120d, a second macro cell 200b including multiple second power lines 220a~220d, multiple first connection parts 320a~320d, and a third power line 420b. The first macro cell 100b may further include a fourth power line 130d, and the second macro cell 200b may further include a fifth power line 230d. The semiconductor integrated circuit 20a may further include a third macro cell 600b and a fourth macro cell 700b.

The first power lines 120a~120d may be formed in a first wiring layer LN, such as the first wiring layer in FIG. 6. The fourth power line 130d may be formed in a third wiring layer L(N−1), such as the third wiring layer L(N−1) in FIG. 6. Such layers of FIG. 6 may be referred to as examples. Each of the first power lines 120a~120d may extend in the first direction D1, and the fourth power line 130d may extend in the second direction D2.

The second macro cell 200b is adjacent to the first macro cell 100b. The second power lines 220a~220d are formed in the first wiring layer LN. The fifth power line 230d may be formed in the third wiring layer L(N−1). Each of the second power lines 220a~220d may extend in the first direction D1, and the fifth power line 230d may extend in the second direction D2.

The third macro cell 600b may be adjacent to the first macro cell 100b, and the fourth macro cell 700b may be adjacent to the second and third macro cells 200b and 600b. The third macro cell 600b may include multiple sixth power lines 620a, 620b, 620c and 620d and a seventh power line 630d. The fourth macro cell 700b may include multiple eighth power lines 720a, 720b, 720c and 720d and a ninth power line 730d. The sixth power lines 620a~620d and the eighth power lines 720a~720d may be formed in the first wiring layer LN. Each of the sixth power lines 620a~620d and the eighth power lines 720a~720d may extend in the first direction D1. The seventh power line 630d and the ninth power line 730d may be formed in the third wiring layer L(N−1). Each of the seventh power line 630d and the ninth power line 730d may extend in the second direction D2.

The first connection parts 320a~320d are formed in the first wiring layer LN. Each of the first connection parts 320a~320d electrically connects a respective one of the first power lines 120a~120d with a respective one of the second power lines 220a~220d.

The semiconductor integrated circuit 20a may further include multiple second connection parts 324a, 324b, 324c and 324d, a third connection part 330d and a fourth connection part 332d. The second connection parts 324a~324d may be formed in the first wiring layer LN. Each of the second connection parts 324a~324d may electrically connect a respective one of the sixth power lines 620a~620d with a respective one of the eighth power lines 720a~720d. The third and fourth connection parts 330d and 332d may be formed in the third wiring layer L(N−1). The third connection part 330d may electrically connect the fourth power line 130d with the seventh power line 630d. The fourth connection part 332d may electrically connect the fifth power line 230d with the ninth power line 730d.

The third power line 420b may be formed in the second wiring layer (e.g., L(N+1) in FIG. 6). The third power line 420b may extend in the second direction D2.

The semiconductor integrated circuit 20a may further include multiple first vias 430a~430d and multiple second vias 430e, 430f, 430g and 430h. Each of the first vias 430a~430d may electrically connect a respective one of the first power lines 120a~120d with the third power line 420b. Each of the second vias 430e~430h may electrically connect a respective one of the sixth power lines 620a~620d with the third power line 420b. The third power line 420b may supply the first power voltage to the first power lines 120a~120d, the second power lines 220a~220d, the sixth power lines 620a~620d and the eighth power lines 720a~720d.

Although not illustrated in FIG. 7, the first macro cell 100b may further include at least one via that electrically connects at least one of the first power lines 120a~120d with the fourth power line 130d, the second macro cell 200b may further include at least one via that electrically connects at least one of the second power lines 220a~220d with the fifth power line 230d, the third macro cell 600b may further include at least one via that electrically connects at least one of the sixth power lines 620a~620d with the seventh power line 630d, and the fourth macro cell 700b may further include at least one via that electrically connects at least one of the eighth power lines 720a~720d with the ninth power line 730d. Thus, the first power voltage may also be supplied to the fourth power line 130d, the fifth power line 230d, the seventh power line 630d and the ninth power line 730d.

Although not illustrated in FIG. 7, the semiconductor integrated circuit 20a may further include at least one signal line that is formed in the second wiring layer L(N+1) and is formed in a region in which the third power line 420b does not exist. For example, a signal line similar to signal line 410 of FIG. 3 may be formed in the second wiring layer L(N+1).

Figure 8:
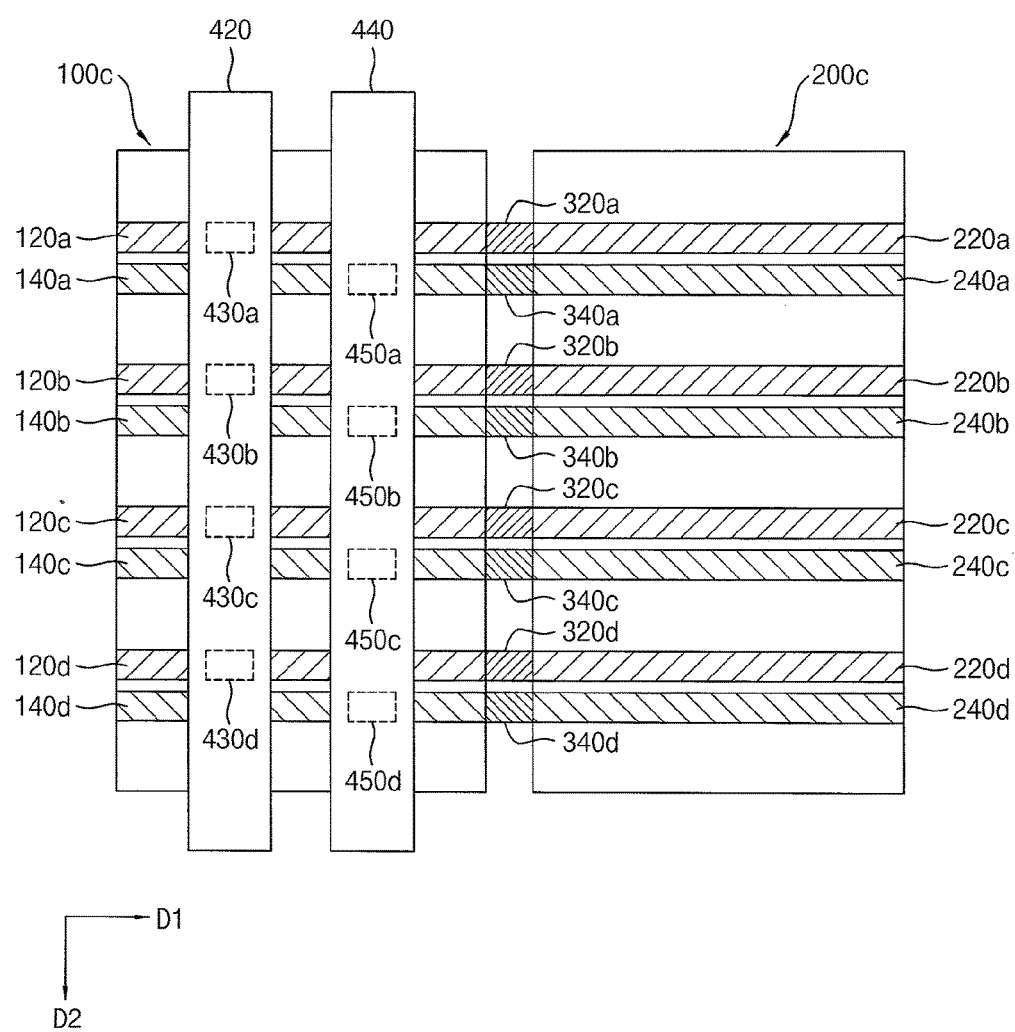
FIGS. 8, 9 and 10 are plan views illustrating a semiconductor integrated circuit according to some embodiments.
Figure 9:
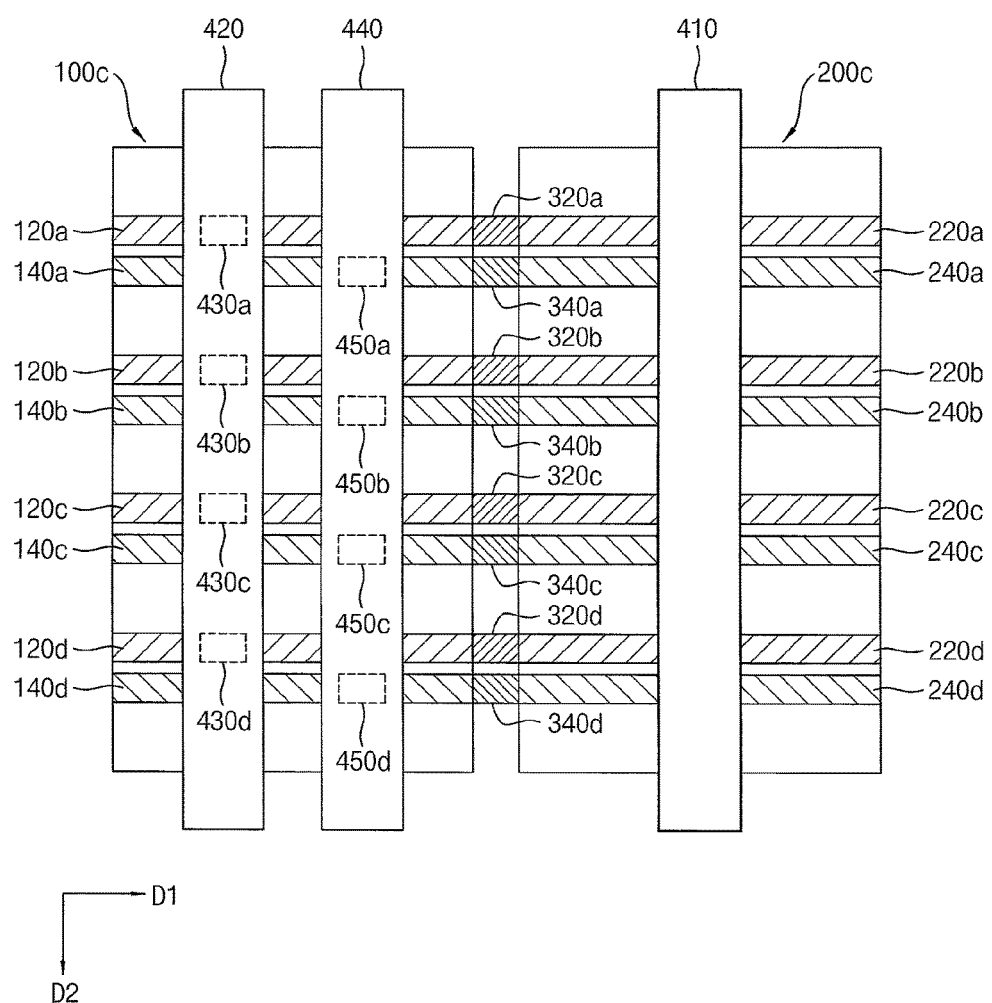
Figure 10:
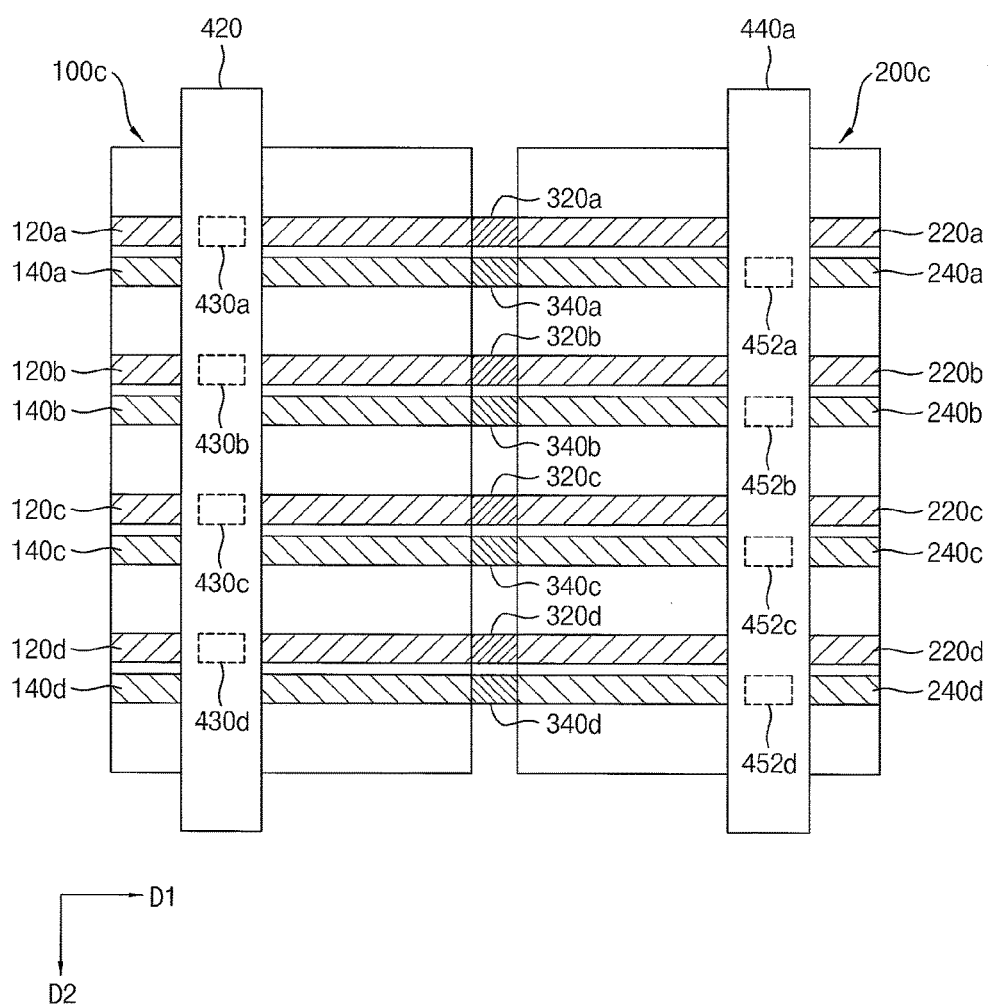

FIGS. 8, 9 and 10 are plan views illustrating a semiconductor integrated circuit according to some embodiments. Referring to FIG. 8, a semiconductor integrated circuit 30 includes a first macro cell 100c including multiple first power lines 120a, 120b, 120c and 120d, a second macro cell 200c including multiple second power lines 220a, 220b, 220c and 220d, multiple first connection parts 320a, 320b, 320c and 320d, and a third power line 420. The first macro cell 100c may further include multiple fourth power lines 140a, 140b, 140c and 140d, and the second macro cell 200c may further include multiple fifth power lines 240a, 240b, 240c and 240d. The semiconductor integrated circuit 30 may further include multiple second connection parts 340a, 340b, 340c and 340d, and a sixth power line 440.

In FIG. 8, the power lines 120a~120d, 220a~220d and 420 may be formed to supply one power voltage to the macro cells 100c and 200c, and the power lines 140a~140d, 240a~240d and 440 may be formed to supply another power voltage to the macro cells 100c and 200c.

The first power lines 120a~120d and the fourth power lines 140a~140d are formed in a first wiring layer LN, such as the first wiring layer LN in FIG. 2. Each of the first power lines 120a~120d and the fourth power lines 140a~140d may extend in a first direction D1. The first power lines 120a~120d and the fourth power lines 140a~140d may be alternately arranged in a second direction D2; however, in other embodiments the first power lines 120a~120d and the fourth power lines 140a~140d may be arranged in different configurations.

The second macro cell 200c is adjacent to the first macro cell 100c. The second power lines 220a~220d and the fifth power lines 240a~240d are formed in the first wiring layer LN. Each of the second power lines 220a~220d and the fifth power lines 240a~240d may extend in the first direction D1. The second power lines 220a~220d and the fifth power lines 240a~240d may be alternately arranged in the second direction D2; however, in other embodiments the second power lines 220a~220d and the fifth power lines 240a~240d may be arranged in different configurations.

The first connection parts 320a~320d and the second connection parts 340a~340d may be formed in the first wiring layer LN. Each of the first connection parts 320a~320d electrically connects a respective one of the first power lines 120a~120d with a respective one of the second power lines 220a~220d. Each of the second connection parts 340a~340d electrically connects a respective one of the fourth power lines 140a~140d with a respective one of the fifth power lines 240a~240d.

In some embodiments, the fourth power lines 140a~140d, the fifth power lines 240a~240d and the second connection parts 340a~340d may be formed of the same material as those of the first power lines 120a~120d, the second power lines 220a~220d and the first connection parts 320a~320d.

The third power line 420 and the sixth power line 440 are formed in a second wiring layer L(N+1), such as the second wiring layer L(N+1) in FIG. 2. Each of the third power line 420 and the sixth power line 440 may extend in the second direction D2.

The third power line 420 may be electrically connected to the first power lines 120a~120d to supply a first power voltage to the first power lines 120a~120d and the second power lines 220a~220d. The sixth power line 440 may be electrically connected to the fourth power lines 140a~140d to supply a second power voltage that may be different from the first power voltage to the fourth power lines 140a~140d and the fifth power lines 240a~240d. For example, the first power voltage may be a high power voltage (e.g., a VDD voltage), and the second power voltage may be a low power voltage (e.g., a ground voltage or a VSS voltage).

The semiconductor integrated circuit 30 may further include multiple first vias 430a, 430b, 430c and 430d and multiple second vias 450a, 450b, 450c and 450d. Each of the first vias 430a~430d and the second vias 450a~450d may extend in a third direction (e.g., D3 in FIG. 2). Each of the first vias 430a~430d may be formed at an intersection of a respective one of the first power lines 120a~120d and the third power line 420, and may electrically connect the respective one of the first power lines 120a~120d with the third power line 420. Each of the second vias 450a~450d may be formed at an intersection of a respective one of the fourth power lines 140a~140d and the sixth power line 440, and may electrically connect the respective one of the fourth power lines 140a~140d with the sixth power line 440.

In the semiconductor integrated circuit 30 according to some embodiments including the connection parts 320a~320d and 340a~340d, the first power voltage may be supplied to both of the macro cells 100c and 200c by electrically connecting the chip-level power line 420 with one of the first power lines 120a~120d and the second power lines 220a~220d, and the second power voltage may be supplied to both of the macro cells 100c and 200c by electrically connecting the chip-level power line 440 with one of the fourth power lines 140a~140d and the fifth power lines 240a~240d. Accordingly, a route congestion of chip-level power lines may be reduced in the semiconductor integrated circuit 30.

Referring to FIG. 9, a semiconductor integrated circuit 30a may be substantially the same as the semiconductor integrated circuit 30 of FIG. 8, except that the semiconductor integrated circuit 30a further includes at least one signal line 410. The semiconductor integrated circuit 30a of FIG. 9 includes a first macro cell 100c including multiple first power lines 120a~120d, a second macro cell 200c including multiple second power lines 220a~220d, multiple first connection parts 320a~320d, and a third power line 420. The first macro cell 100c may further include multiple fourth power lines 140a~140d, and the second macro cell 200c may further include multiple fifth power lines 240a~240d. The semiconductor integrated circuit 30a of FIG. 9 may further include multiple second connection parts 340a~340d, a sixth power line 440, the signal line 410, multiple first vias 430a~430d and multiple second vias 450a~450d. The signal line 410 in FIG. 9 may be substantially the same as the signal line 410 in FIG. 3.

In the semiconductor integrated circuit 30a according to some embodiments, the at least one signal line 410 may be arranged in an empty region in the wiring layer (e.g., L(N+1) in FIG. 2) including the chip-level power lines 420 and 440. Accordingly, the semiconductor integrated circuit 30a may have relatively low complexity, small size and low manufacturing cost.

Referring to FIG. 10, a semiconductor integrated circuit 30b may be substantially the same as the semiconductor integrated circuit 30 of FIG. 8, except that arrangements of a sixth power line 440a and multiple second vias 452a, 452b, 452c and 452d are changed. The semiconductor integrated circuit 30b of FIG. 10 includes a first macro cell 100c including multiple first power lines 120a~120d, a second macro cell 200c including multiple second power lines 220a~220d, multiple first connection parts 320a~320d, and a third power line 420. The first macro cell 100c may further include multiple fourth power lines 140a~140d, and the second macro cell 200c may further include multiple fifth power lines 240a~240d. The semiconductor integrated circuit 30b of FIG. 10 may further include multiple second connection parts 340a~340d, the sixth power line 440a, multiple first vias 430a~430d and the second vias 452a~452d.

The sixth power line 440a may be formed in the second wiring layer (e.g., L(N+1) in FIG. 2). The sixth power line 440a may be electrically connected to the fifth power lines 240a~240d to supply the second power voltage to the fourth power lines 140a~140d and the fifth power lines 240a~240d. The second vias 452a~452d may extend in the third direction (e.g., D3 in FIG. 2). Each of the second vias 452a~452d may be formed at an intersection of a respective one of the fifth power lines 240a~240d and the sixth power line 440a, and may electrically connect the respective one of the fifth power lines 240a~240d with the sixth power line 440a.

Figure 11:
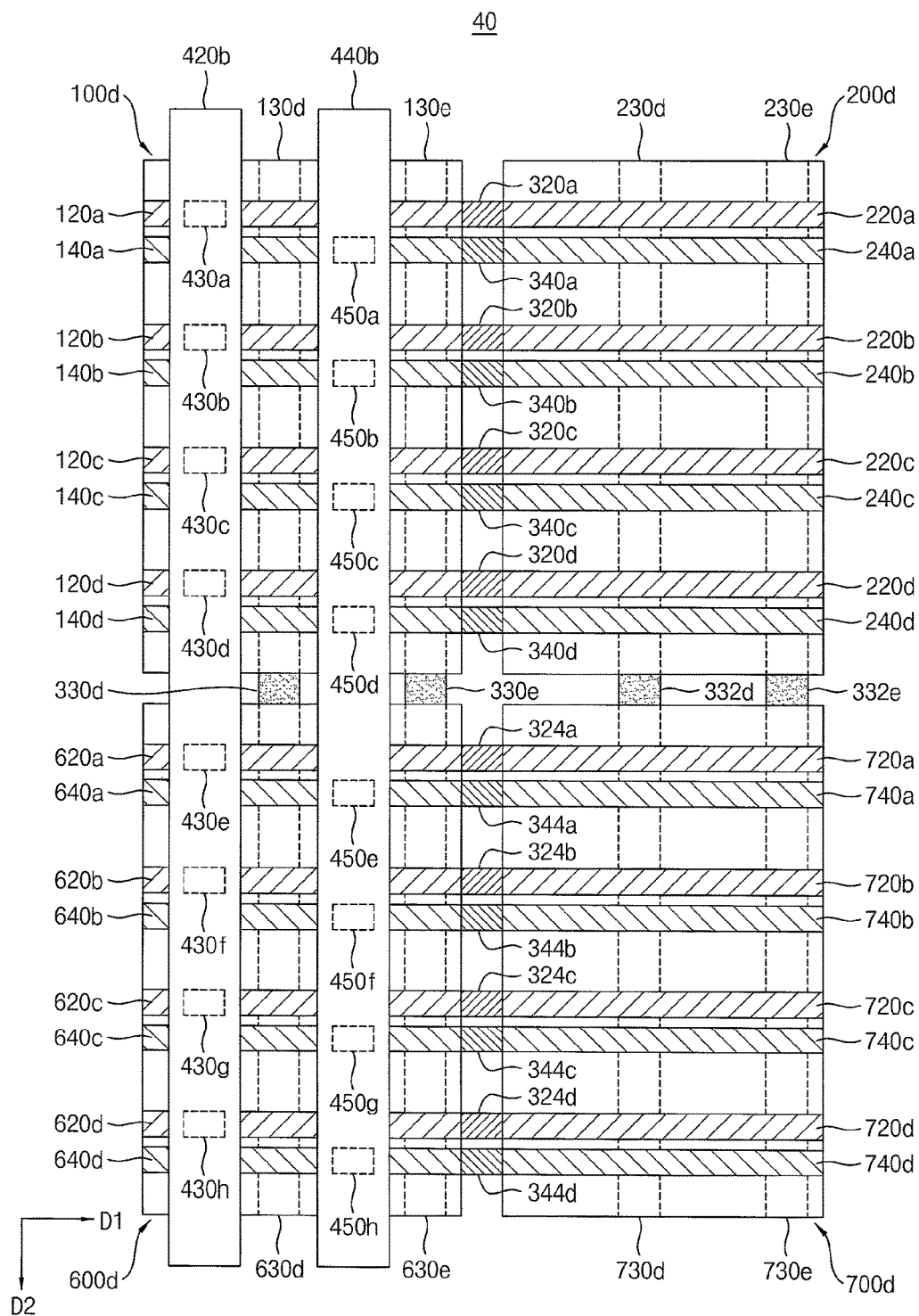
FIGS. 11, 12 and 13 are plan views illustrating a semiconductor integrated circuit according to some embodiments.
Figure 12:
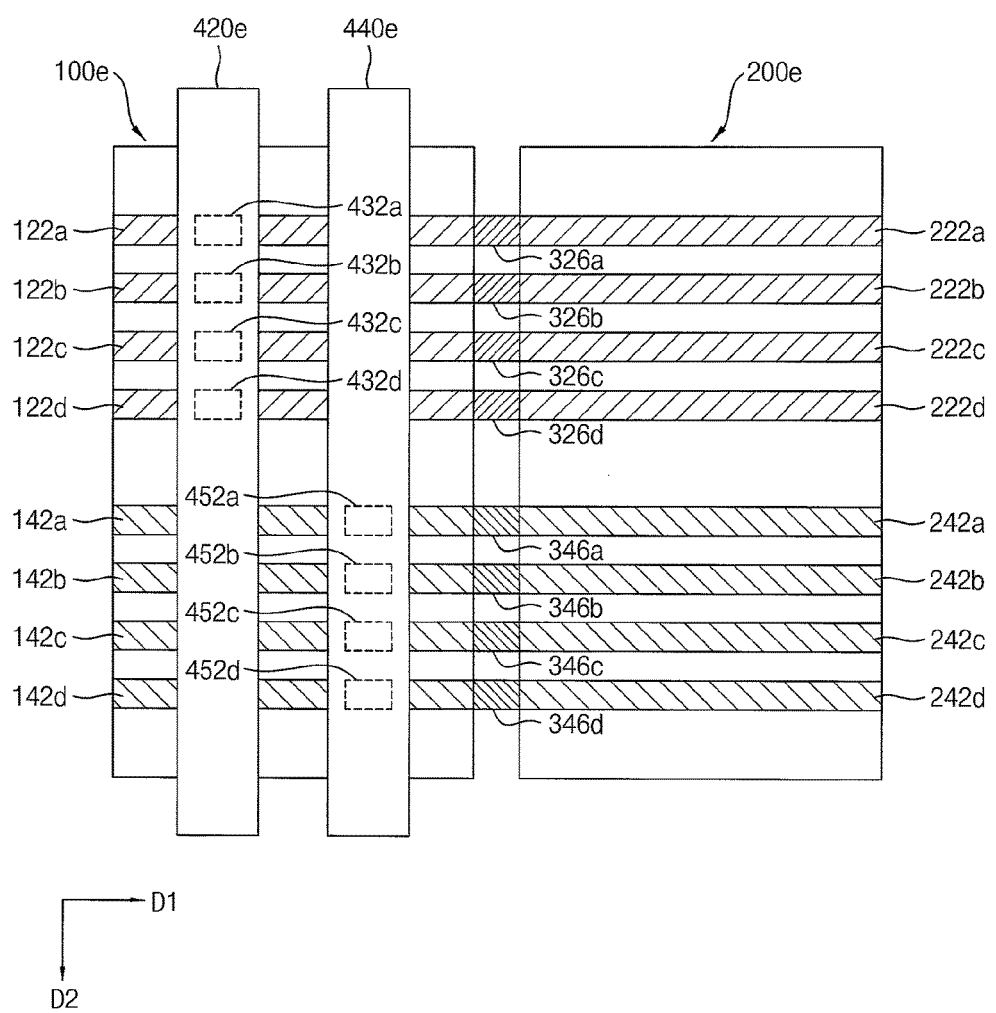
Figure 13:
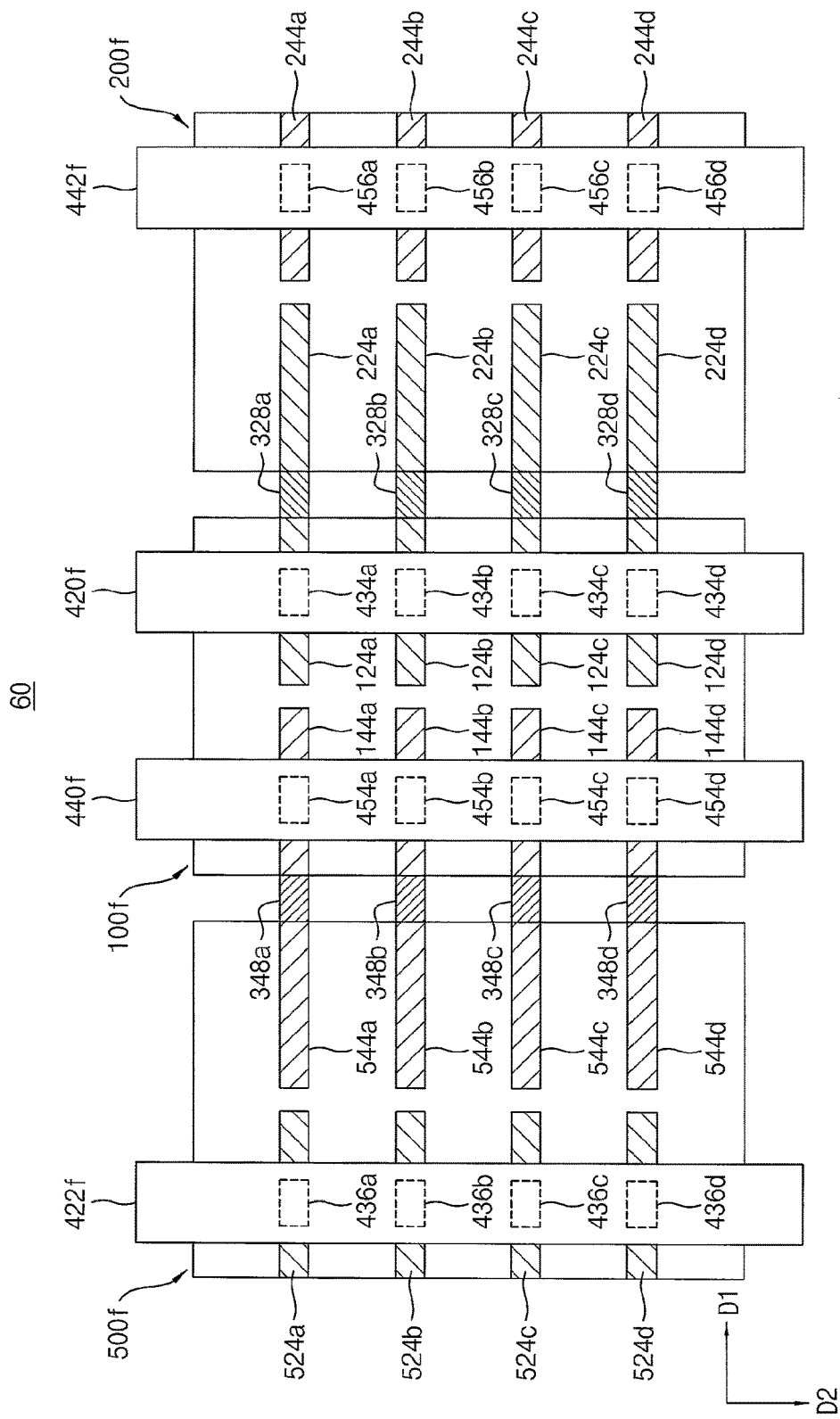

FIGS. 11, 12 and 13 are plan views illustrating a semiconductor integrated circuit according to some embodiments. Referring to FIG. 11, a semiconductor integrated circuit 40 includes a first macro cell 100d including multiple first power lines 120a, 120b, 120c and 120d, a second macro cell 200d including multiple second power lines 220a, 220b, 220c and 220d, multiple first connection parts 320a, 320b, 320c and 320d, and a third power line 420b. The first macro cell 100d may further include multiple fourth power lines 140a, 140b, 140c and 140d, and the second macro cell 200d may further include multiple fifth power lines 240a, 240b, 240c and 240d. The semiconductor integrated circuit 40 may further include a sixth power line 440b, a third macro cell 600d and a fourth macro cell 700d.

The first power lines 120a~120d and the fourth power lines 140a~140d are formed in a first wiring layer LN, such as the first wiring layer LN in FIG. 6. The first macro cell 100d may further include multiple seventh power lines 130d and 130e that are formed in a third wiring layer L(N−1), such as the third wiring layer L(N−1) in FIG. 6.

The second macro cell 200d is adjacent to the first macro cell 100d. The second power lines 220a~220d and the fifth power lines 240a~240d may be formed in the first wiring layer LN. The second macro cell 200d may further include multiple eighth power lines 230d and 230e that are formed in the third wiring layer L(N−1).

The third macro cell 600d may be adjacent to the first macro cell 100d, and the fourth macro cell 700d may be adjacent to the second and third macro cells 200d and 600d. The third macro cell 600d may include multiple ninth power lines 620a, 620b, 620c and 620d, multiple tenth power lines 640a, 640b, 640c and 640d, and multiple eleventh power lines 630d and 630e. The fourth macro cell 700d may include multiple twelfth power lines 720a, 720b, 720c and 720d, multiple thirteenth power lines 740a, 740b, 740c and 740d, and multiple fourteenth power lines 730d and 730e. The ninth power lines 620a~620d, the tenth power lines 640a~640d, the twelfth power lines 720a~720d and the thirteenth power lines 740a~740d may be formed in the first wiring layer LN. The eleventh power lines 630d~630e and the fourteenth power lines 730d~730e may be formed in the third wiring layer L(N−1).

The first connection parts 320a~320d are formed in the first wiring layer LN. Each of the first connection parts 320a~320d electrically connects a respective one of the first power lines 120a~120d with a respective one of the second power lines 220a~220d.

The semiconductor integrated circuit 40 may further include multiple second connection parts 340a, 340b, 340c and 340d, multiple third connection parts 324a, 324b, 324c and 324d, multiple fourth connection parts 344a, 344b, 344c and 344d, multiple fifth connection part 330d and 330e, and multiple sixth connection part 332d and 332e. The second connection parts 340a~340d, the third connection parts 324a~324d and the fourth connection parts 344a~344d may be formed in the first wiring layer LN. Each of the second connection parts 340a~340d may electrically connect a respective one of the fourth power lines 140a~140d with a respective one of the fifth power lines 240a~240d. Each of the third connection parts 324a~324d may electrically connect a respective one of the ninth power lines 620a~620d with a respective one of the twelfth power lines 720a~720d. Each of the fourth connection parts 344a~344d may electrically connect a respective one of the tenth power lines 640a~640d with a respective one of the thirteenth power lines 740a~740d. The fifth connection part 330d~330e and the sixth connection part 332d~332e may be formed in the third wiring layer L(N−1). Each of the fifth connection part 330d~330e may electrically connect a respective one of the seventh power lines 130d~130e with a respective one of the eleventh power lines 630d~630e. Each of the sixth connection part 332d~332e may electrically connect a respective one of the eighth power lines 230d~230e with a respective one of the fourteenth power lines 730d~730e.

The third power line 420b and the sixth power line 440b are formed in a second wiring layer (e.g., L(N+1) in FIG. 6).

The semiconductor integrated circuit 40 may further include multiple first vias 430a, 430a, 430c and 430d, multiple second vias 450a, 450a, 450c and 450d, multiple third vias 430e, 430f, 430g and 430h, and multiple fourth vias 450e, 450f, 450g and 450h. Each of the first vias 430a~430d may electrically connect a respective one of the first power lines 120a~120d with the third power line 420b. Each of the third vias 430e~430h may electrically connect a respective one of the ninth power lines 620a~620d with the third power line 420b. The third power line 420b may supply a first power voltage to the first power lines 120a~120d, the second power lines 220a~220d, the ninth power lines 620a~620d and the twelfth power lines 720a~720d. Each of the second vias 450a~450d may electrically connect a respective one of the fourth power lines 140a~140d with the sixth power line 440b. Each of the fourth vias 450e~450h may electrically connect a respective one of the tenth power lines 640a~640d with the sixth power line 440b. The sixth power line 440b may supply a second power voltage to the fourth power lines 140a~140d, the fifth power lines 240a~240d, the tenth power lines 640a~640d and the thirteenth power lines 740a~740d.

Referring to FIG. 12, a semiconductor integrated circuit 50 includes a first macro cell 100e including multiple first power lines 122a, 122b, 122c and 122d, a second macro cell 200e including multiple second power lines 222a, 222b, 222c and 222d, multiple first connection parts 326a, 326b, 326c and 326d, and a third power line 420e. The first macro cell 100e may further include multiple fourth power lines 142a, 142b, 142c and 142d, and the second macro cell 200e may further include multiple fifth power lines 242a, 242b, 242c and 242d. The semiconductor integrated circuit 50 may further include multiple second connection parts 346a, 346b, 346c and 346d, and a sixth power line 440e.

The first power lines 122a~122d and the fourth power lines 142a~142d are formed in a first wiring layer LN, such as the first wiring layer LN in FIG. 2. The second macro cell 200e is adjacent to the first macro cell 100e. The second power lines 222a~222d and the fifth power lines 242a~242d are formed in the first wiring layer LN.

In FIG. 12, the first power lines 122a~122d and the fourth power lines 142a~142d may be spaced apart from each other, and the second power lines 222a~222d and the fifth power lines 242a~242d may be spaced apart from each other. For example, the first power lines 122a~122d may be arranged in a first region (e.g., an upper region) of the first macro cell 100e, and the fourth power lines 142a~142d may be arranged in a second region (e.g., a lower region) of the first macro cell 100e. Here, upper and lower may be relative positions in direction D2.

The first connection parts 326a~326d and the second connection parts 346a~346d are formed in the first wiring layer LN. Each of the first connection parts 326a~326d electrically connects a respective one of the first power lines 122a~122d with a respective one of the second power lines 222a~222d. Each of the second connection parts 346a~346d electrically connects a respective one of the fourth power lines 142a~142d with a respective one of the fifth power lines 242a~242d.

The third power line 420e and the sixth power line 440e are formed in a second wiring layer (e.g., L(N+1) in FIG. 2).

The semiconductor integrated circuit 50 may further include multiple first vias 432a, 432b, 432c and 432d and multiple second vias 452a, 452b, 452c and 452d. Each of the first vias 432a~432d may electrically connect a respective one of the first power lines 122a~122d with the third power line 420e. Each of the second vias 452a~452d may electrically connect a respective one of fourth power lines 142a~142d with the sixth power line 440e. The third power line 420e may supply a first power voltage to the first power lines 122a~122d and the second power lines 222a~222d. The sixth power line 440e may supply a second power voltage to the fourth power lines 142a~142d and the fifth power lines 242a~242d.

Referring to FIG. 13, a semiconductor integrated circuit 60 includes a first macro cell 100f including multiple first power lines 124a, 124b, 124c and 124d, a second macro cell 200f including multiple second power lines 224a, 224b, 224c and 224d, multiple first connection parts 328a, 328b, 328c and 328d, and a third power line 420f. The first macro cell 100f may further include multiple fourth power lines 144a, 144b, 144c and 144d, and the second macro cell 200f may further include multiple fifth power lines 244a, 244b, 244c and 244d. The semiconductor integrated circuit 60 may further include multiple second connection parts 348a, 348b, 348c and 348d, a sixth power line 440f, and a third macro cell 500f.

The first power lines 124a~124d and the fourth power lines 144a~144d are formed in a first wiring layer LN, such as the first wiring layer LN in FIG. 2. The second macro cell 200f is adjacent to the first macro cell 100f. The second power lines 224a~224d and the fifth power lines 244a~244d are formed in the first wiring layer LN.

The third macro cell 500f may be adjacent to the first macro cell 100f. The third macro cell 500f may include multiple seventh power lines 524a, 524b, 524c and 524d, and multiple eighth power lines 544a, 544b, 544c and 544d. The seventh power lines 524a~524d and the eighth power lines 544a~544d may be formed in the first wiring layer LN.

In FIG. 13, the first power lines 124a~124d and the fourth power lines 144a~144d may be spaced apart from each other, the second power lines 224a~224d and the fifth power lines 244a~244d may be spaced apart from each other, and the seventh power lines 524a~524d and the eighth power lines 544a~544d may be spaced apart from each other. For example, the first power lines 124a~124d may be arranged in a first region (e.g., a right region) of the first macro cell 100f, and the fourth power lines 144a~144d may be arranged in a second region (e.g., a left region) of the first macro cell 100f.

The first connection parts 328a~328d and the second connection parts 348a~348d are formed in the first wiring layer LN. Each of the first connection parts 328a~328d electrically connects a respective one of the first power lines 124a~124d with a respective one of the second power lines 224a~224d. Each of the second connection parts 348a~348d electrically connects a respective one of the fourth power lines 144a~144d with a respective one of the eighth power lines 544a~544d.

The third power line 420f and the sixth power line 440f are formed in a second wiring layer (e.g., L(N+1) in FIG. 2).

The semiconductor integrated circuit 60 may further include multiple first vias 434a, 434b, 434c and 434d and multiple second vias 454a, 454b, 454c and 454d. Each of the first vias 434a~434d may electrically connect a respective one of the first power lines 124a~124d with the third power line 420f. Each of the second vias 454a~454d may electrically connect the respective one of fourth power lines 144a~144d with the sixth power line 440f.

The semiconductor integrated circuit 60 may further include a ninth power line 422f, a tenth power line 442f, multiple third vias 436a, 436b, 436c and 436d, and multiple fourth vias 456a, 456b, 456c and 456d. Each of the third vias 436a~436d may electrically connect a respective one of the seventh power lines 524a~524d with the ninth power line 422f. Each of the fourth vias 456a~456d may electrically connect a respective one of fifth power lines 244a~244d with the tenth power line 442f.

The third power line 420f and the ninth power line 422f may supply a first power voltage to the first power lines 124a~124d, the second power lines 224a~224d and the seventh power lines 524a~524d. The sixth power line 440f and the tenth power line 442f may supply a second power voltage to the fourth power lines 144a~144d, the fifth power lines 244a~244d and the eighth power lines 544a~544d.

Figure 14:
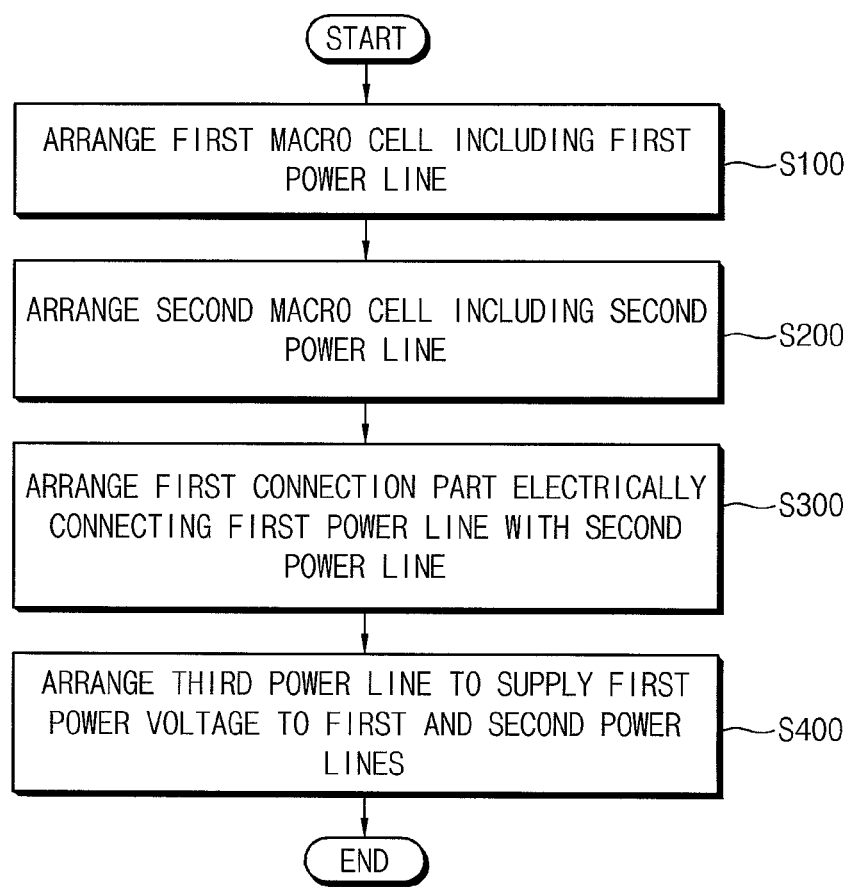
FIG. 14 is a flow chart illustrating a method of designing a semiconductor integrated circuit according to some embodiments.

FIG. 14 is a flow chart illustrating a method of designing a semiconductor integrated circuit according to some embodiments. Referring to FIGS. 1, 2 and 14, in a method of designing the semiconductor integrated circuit 10 according to some embodiments, the first macro cell 100 including the first power lines 120a~120d is arranged in the semiconductor integrated circuit 10 in S100. The second macro cell 200 including the second power lines 220a~220d is arranged to be adjacent to the first macro cell 100 in the semiconductor integrated circuit 10 in S200. The first connection parts 320a~320d electrically connecting the first power lines 120a~120d with the second power lines 220a~220d are arranged in the semiconductor integrated circuit 10 in S300. The third power line 420 electrically connected to the first power lines 120a~120d is arranged in the semiconductor integrated circuit 10 such that a first power voltage is to be supplied to the first power lines 120a~120d and the second power lines 220a~220d through the third power line 420 in S400. The first power lines 120a~120d, the second power lines 220a~220d and the first connection parts 320a~320d are formed in the first wiring layer LN. The third power line 420 is formed in the second wiring layer L(N+1) that is different from the first wiring layer LN.

In some embodiments, the third power line 420 may be electrically connected to the first power lines 120a~120d by the first vias 430a~430d. That is, in S400, first vias 430a~430d may be formed to be electrically connected to the first power lines 120a~120d, respectively and the third power line 420 may be formed to be electrically connected to the first vias 430a~430d.

In some embodiments, the method of designing the semiconductor integrated circuit according to some embodiments may be employed to a design tool, such as an IC compiler.

In some embodiments, the semiconductor integrated circuit according to some embodiments may be implemented as a semiconductor chip that is included in an electronic system. For example, the electronic system may include a processor and multiple functional blocks controlled by the processor, and the processor in the electronic system may have a structure of the semiconductor integrated circuit according to some embodiments.

Some embodiments include a semiconductor integrated circuit capable of efficiently supplying power to multiple macro cells.

Some embodiments include an electronic system including the semiconductor integrated circuit.

In some embodiments, a semiconductor integrated circuit includes a first macro cell including a first power line, a second macro cell including a second power line, a first connection part and a third power line. The first power line is formed in a first wiring layer. The second macro cell is adjacent to the first macro cell. The second power line is formed in the first wiring layer. The first connection part is formed in the first wiring layer, and electrically connects the first power line with the second power line. The third power line is formed in a second wiring layer different from the first wiring layer, and is electrically connected to the first power line to supply a first power voltage to the first power line and the second power line.

In some embodiments, each of the first power line and the second power line may extend in a first direction. The third power line may extend in a second direction crossing the first direction.

In some embodiments, the semiconductor integrated circuit may further include a first via. The first via may be formed at an intersection of the first power line and the third power line, may extend in a third direction perpendicular to the first direction and the second direction, and may electrically connect the first power line with the third power line.

In some embodiments, the semiconductor integrated circuit may further include at least one signal line. The at least one signal line may be formed in the second wiring layer and in a region in which the third power line does not exist, and may supply a signal to drive at least one of the first macro cell and the second macro cell.

In some embodiments, the semiconductor integrated circuit may further include a third macro cell and a second connection part. The third macro cell may be adjacent to the first macro cell, and may include a fourth power line in the first wiring layer. The second connection part may be formed in the first wiring layer, and may electrically connect the first power line with the fourth power line.

In some embodiments, the first macro cell may further include a fourth power line in a third wiring layer different from the first wiring layer and the second wiring layer. The second macro cell may further include a fifth power line in the third wiring layer. The semiconductor integrated circuit may further include a second connection part. The second connection part may be formed in the third wiring layer, and may electrically connect the fourth power line with the fifth power line.

In some embodiments, the first macro cell may further include a fourth power line in a third wiring layer different from the first wiring layer and the second wiring layer. The semiconductor integrated circuit may further include a third macro cell and a second connection part. The third macro cell may be adjacent to the first macro cell, and may include a fifth power line in the first wiring layer and a sixth power line in the third wiring layer. The second connection part may be formed in the third wiring layer, and may electrically connect the fourth power line with the sixth power line.

In some embodiments, the third power line may be electrically connected to the fifth power line to supply the first power voltage to the fifth power line.

In some embodiments, the first macro cell may further include a fourth power line in the first wiring layer. The second macro cell may further include a fifth power line in the first wiring layer. The semiconductor integrated circuit may further include a second connection part. The second connection part may be formed in the first wiring layer, and may electrically connect the fourth power line with the fifth power line.

In some embodiments, the third power line may be electrically connected to the fourth power line to supply the first power voltage to the fourth power line and the fifth power line.

In some embodiments, the semiconductor integrated circuit may further include a sixth power line. The sixth power line may be formed in the second wiring layer, and may be electrically connected to one of the fourth power line and the fifth power line to supply a second power voltage different from the first power voltage to the fourth power line and the fifth power line.

In some embodiments, the first connection part may be formed of the same material as those of the first and second power lines.

In some embodiments, the first macro cell may have a structure the same as that of the second macro cell.

In some embodiments, each of the first macro cell and the second macro cell may be a hard macro cell in which a structure is unchangeable.

Some embodiments include an electronic system including a processor and multiple functional blocks controlled by the processor. The processor includes a first macro cell including a first element and a first power line, a second macro cell including a second element and a second power line, a first connection part and a third power line. The first power line is formed in a first wiring layer. The second macro cell is adjacent to the first macro cell. The second power line is formed in the first wiring layer. The first connection part is formed in the first wiring layer, and electrically connects the first power line with the second power line. The third power line is formed in a second wiring layer different from the first wiring layer, and is electrically connected to the first power line to supply a first power voltage to the first element and the second element through the first power line and the second power line.

In some embodiments, a power voltage may be supplied to all of macro cells by electrically connecting a chip-level power line with one of the macro cells, and thus a route congestion of chip-level power lines may be reduced in the semiconductor integrated circuit. In addition, the chip-level power line and at least one signal line may be arranged in the same wiring layer, and thus the semiconductor integrated circuit may have relatively low complexity, small size and low manufacturing cost.

An embodiment of the electronic system including the semiconductor integrated circuit according to some embodiments will be described below.

FIG. 15 is a block diagram illustrating a memory system including a semiconductor integrated circuit according to some embodiments. Referring to FIG. 15, a memory system 1300 includes a processor 1310, a system controller 1320 and a memory device 1330. The memory system 1300 may further include an input device 1350, an output device 1360 and a storage device 1370.

The memory device 1330 may include multiple memory modules 1334 and a memory controller 1332 for controlling the memory modules 1334. The memory modules 1334 may include at least one volatile memory, such as a dynamic random access memory (DRAM), a static random access memory (SRAM), and/or at least one nonvolatile memory, such as an electrically erasable programmable read-only memory (EEPROM), a flash memory, a phase change random access memory (PRAM), a resistance random access memory (RRAM), a magnetic random access memory (MRAM), a ferroelectric random access memory (FRAM), a nanofloating gate memory (NFGM), or a polymer random access memory (PoRAM). The memory controller 1332 may be included in the system controller 1320.

The processor 1310 may perform various computing functions, such as executing specific software for performing specific calculations or tasks. The processor 1310 may be connected to the system controller 1320 via a processor bus. The system controller 1320 may be connected to the input device 1350, the output device 1360 and the storage device 1370 via an expansion bus. As such, the processor 1310 may control the input device 1350, the output device 1360 and the storage device 1370 using the system controller 1320.

A semiconductor chip included in the memory system 1300 may be implemented with the semiconductor integrated circuit according to some embodiments, e.g., the examples described above with reference to FIGS. 1 through 13. For example, the processor 1310 may be implemented as one semiconductor chip (e.g., a processor chip), and the memory modules 1334 may include multiple semiconductor chip (e.g., memory chips). Each semiconductor chip may include multiple macro cells. A power voltage may be supplied to all of the macro cells by electrically connecting a chip-level power line with one of the macro cells, and thus a route congestion of chip-level power lines may be reduced in each semiconductor chip. In addition, the chip-level power line and at least one signal line may be arranged in the same wiring layer, and thus each semiconductor chip may have relatively low complexity, small size and low manufacturing cost.

Although FIG. 15 illustrates the memory system as an example of the electronic system, examples of the electronic system may not be limited thereto. For example, the electronic system may be any system such as a display system, an image sensor system, a mobile system, a computing system, or other electronic systems. A timing controller chip included in the display system and/or the image sensor system, an application processor (AP) chip included in the mobile system, and a processor chip included in the computing system may be implemented with the semiconductor integrated circuit according to some embodiments.

Embodiments may be used in any device or system including a semiconductor device, such as a mobile phone, a smart phone, a personal digital assistants (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, or the like.

The foregoing is illustrative of some embodiments and is not to be construed as limiting thereof. Although particular embodiments have been described, those skilled in the art will readily appreciate that many modifications are possible without materially departing from the novel teachings and advantages described herein. Accordingly, all such modifications are intended to be included within the scope of this disclosure as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor integrated circuit comprising:
   a first macro cell including a first power line in a first wiring layer;
   a second macro cell adjacent to the first macro cell, the second macro cell including a second power line in the first wiring layer;
   a first connection part in the first wiring layer, the first connection part electrically connecting the first power line with the second power line; and
   a third power line in a second wiring layer different from the first wiring layer, the third power line electrically connected to the first power line,
   wherein the second power line is electrically connected to the third power line through the first connection part.

2. The semiconductor integrated circuit of claim 1, wherein:
   each of the first power line and the second power line extends in a first direction; and
   the third power line extends in a second direction crossing the first direction.

3. The semiconductor integrated circuit of claim 1, further comprising a first via disposed at an intersection of the first power line and the third power line electrically connecting the first power line with the third power line.

4. The semiconductor integrated circuit of claim 1, further comprising at least one signal line in the second wiring layer, separate from the third power line, and electrically connected to a circuit within at least one of the first macro cell and the second macro cell.

5. The semiconductor integrated circuit of claim 1, further comprising:
   a third macro cell adjacent to the first macro cell, the third macro cell including a fourth power line in the first wiring layer; and
   a second connection part in the first wiring layer, the second connection part electrically connecting the first power line with the fourth power line,
   wherein the fourth power line is electrically connected to the third power line through the second connection part.

6. The semiconductor integrated circuit of claim 1, wherein:
   the first macro cell further includes a fourth power line in a third wiring layer different from the first wiring layer and the second wiring layer;
   the second macro cell further includes a fifth power line in the third wiring layer; and
   the semiconductor integrated circuit further includes a second connection part disposed in the third wiring layer, the second connection part electrically connecting the fourth power line with the fifth power line.

7. The semiconductor integrated circuit of claim 1, wherein:
   the first macro cell further includes a fourth power line in a third wiring layer different from the first wiring layer and the second wiring layer; and
   the semiconductor integrated circuit further includes:
      a third macro cell adjacent to the first macro cell, the third macro cell including a fifth power line in the first wiring layer and a sixth power line in the third wiring layer; and
      a second connection part in the third wiring layer, the second connection part electrically connecting the fourth power line with the sixth power line.

8. The semiconductor integrated circuit of claim 7, wherein the third power line is electrically connected to the fifth power line to supply a first power voltage to the fifth power line.

9. The semiconductor integrated circuit of claim 1, wherein:
   the first macro cell further includes a fourth power line in the first wiring layer;
   the second macro cell further includes a fifth power line in the first wiring layer; and
   the semiconductor integrated circuit further includes a second connection part in the first wiring layer, the second connection part electrically connecting the fourth power line with the fifth power line.

10. The semiconductor integrated circuit of claim 9, wherein the third power line is electrically connected to the fourth power line to supply a first power voltage to the fourth power line and the fifth power line.

11. The semiconductor integrated circuit of claim 9, further comprising a sixth power line in the second wiring layer, the sixth power line electrically connected to one of the fourth power line and the fifth power line.

12. The semiconductor integrated circuit of claim 11, wherein the third power line is disposed over the first macro cell and the sixth power line is disposed over the second macro cell.

13. The semiconductor integrated circuit of claim 1, wherein the first connection part is formed of the same material as those of the first and second power lines.

14. The semiconductor integrated circuit of claim 1, wherein the first macro cell has a structure that is the same as that of the second macro cell.

15. An electronic system comprising:
   a processor; and
   a plurality of functional blocks controlled by the processor,
   wherein the processor includes:
      a first macro cell including a first element and a first power line in a first wiring layer;
      a second macro cell adjacent to the first macro cell, the second macro cell including a second element and a second power line in the first wiring layer;
      a first connection part in the first wiring layer, the first connection part electrically connecting the first power line with the second power line; and a third power line in a second wiring layer different from the first wiring layer, the third power line electrically connected to the first power line so that a power voltage is supplied to the first element and the second element through the first power line and the second power line, respectively.

* * * * *